US006833728B2

(12) United States Patent
Chennupati

(10) Patent No.: US 6,833,728 B2
(45) Date of Patent: Dec. 21, 2004

(54) SIMULTANEOUS BIDIRECTIONAL SIGNAL TRANSMISSION

(75) Inventor: Siva Raghuram Chennupati, Munich (DE)

(73) Assignee: Infineon Technologies AG, Munich (DE)

( * ) Notice: Subject to any disclaimer, the term of this patent is extended or adjusted under 35 U.S.C. 154(b) by 599 days.

(21) Appl. No.: 10/002,396

(22) Filed: Oct. 23, 2001

(65) Prior Publication Data

US 2003/0075991 A1 Apr. 24, 2003

(51) Int. Cl.[7] ................................................ H03K 17/16

(52) U.S. Cl. ............................... 326/30; 326/86; 710/1; 710/7; 710/20; 710/22

(58) Field of Search ........................ 326/30, 86; 710/22, 710/1, 7, 20; 365/198; 327/565

(56) References Cited

U.S. PATENT DOCUMENTS 4,245,301 A * 1/1981 Rokutanda et al. ......... 364/200
5,557,236 A 9/1996 Monti ........................ 327/565
5,721,838 A * 2/1998 Takahashi et al. .......... 710/302

* cited by examiner

*Primary Examiner*—Connie C. Yoha
(74) *Attorney, Agent, or Firm*—Fish & Richardson P.C.

(57) ABSTRACT

A system for simultaneous bi-directional transmission of signals over transmission lines between devices having interface ports includes a first circuit for generating the output signal and a second circuit having first and second terminals. The first terminal is coupled to the first circuit and the second terminal is coupled to the interface port. A signal level at the first terminal corresponds to a first combination of the input and output signals, and a signal level at the second terminal corresponds to a second combination of the input and output signals. A third circuit is coupled to the first and second terminals of the second circuit for determining the input signal based on the first and second combinations of the input and output signal levels.

28 Claims, 2 Drawing Sheets

SIMULTANEOUS BIDIRECTIONAL SIGNAL TRANSMISSION

TECHNICAL FIELD

This invention relates to an electronic circuit having an interface port.

BACKGROUND

Integrated circuits send output signals and receive input signals through input/output pins. To prevent input signals from interfering with output signals, an input pin may be dedicated for receiving input signals, and an output pin may be dedicated for transmitting output signals. A single bi-directional pin can also be used to allow input and output signals to pass through the pin at different times. Use of bi-directional pins reduces the number of pins on the integrated circuit package and therefore decreases its size. However, conventional bi-directional pins reduce the rate at which signals can be received and transmitted because only one signal can appear at the bi-directional pin at any given instant to prevent signal interference.

SUMMARY

In general, in one aspect, the invention is directed to an apparatus having an interface port for simultaneously transmitting and receiving input and output signals. The apparatus includes a first circuit for generating the output signal and a second circuit having first and second terminals with the first terminal coupled to the first circuit and the second terminal coupled to the interface port. A signal level at the first terminal represents a first combination of the input and output signals, and a signal level at the second terminal represents a second combination of the input and output signals. A third circuit is coupled to the first and second terminals of the second circuit for determining the input signal based on the signal levels at the first and second terminals. This aspect may include one or more of the following features.

The third circuit processes the signal levels at the first and second terminals to generate a signal corresponding to the input signal. The third circuit multiplies the signal level at the first terminal by a first constant to generate a first number, and multiplies the signal level at the second terminal by a second constant to generate a second number. The difference between the second and the first numbers corresponds to the input signal. When the interface port is coupled to a transmission line having an impedance of Z, and the second circuit has a resistance of Ra, the ratio between the first constant and the second constant is selected to be approximately equal to Z/(Z+Ra). When a resistance of Rc exits between the interface port and the transmission line, a resistance of Rb exists between the interface port and the electric ground, the ratio between the first constant and the second constant is selected to be approximately equal to Rb*(Z+Rc)/(Rb* (Z+Rc)+Ra*(Rb+Rc+Z)).

In general, in another aspect, the invention is directed to a system including a transmission line having first end and second ends with signals sent bi-directionally on the transmission line simultaneously. The system includes a first driver for generating a first output signal, and a first bridge having a first terminal coupled to the first driver and a second terminal coupled to the first end of the transmission line. The system further includes a second driver for generating a second output signal, and a second bridge having a first terminal coupled to the second driver and a second terminal coupled to the second end of the transmission line. The system further includes a first arithmetic unit for processing the signal levels at the first and second terminals of the first bridge to generate a first computed signal that corresponds to the second output signal. The system further includes a second arithmetic unit for processing the signal levels at the first and second terminals of the second bridge to generate a second computed signal that corresponds to the first output signal.

In general, in another aspect, the invention is directed to a memory chip that has an interface pin for simultaneously reading in write data to the memory chip and sending out read data from the memory chip. The memory chip includes a driver for generating the read data, and an internal impedance/resistance having a first terminal coupled to the driver and a second terminal coupled to the interface pin. The memory chip further includes an arithmetic unit for processing signal levels at the first and second terminals of the internal impedance/resistance and for generating a signal corresponding to the write data.

In general, in another aspect, the invention is directed to a system that includes a data bus, a processor, and a memory. The data bus has a first end and a second end. The processor has a first arithmetic unit and a first interface port coupled to the first end of the data bus. The memory has a second arithmetic unit and a second interface port coupled to the second end of the data bus. The processor sends a write signal via the data bus to the memory at the same time that the memory sends a read signal via the data bus to the processor. The first arithmetic unit processes combinations of the write and read signals to generate a first computed signal corresponding to the read signal. The second arithmetic unit processes combinations of the read and write signals to generate a second computed signal corresponding to the write signal.

In general, in another aspect, the invention is directed to a system that includes a data bus having a first end and a second end, a first device, and a second device. The first device has a first driver for generating a first output signal, a first bridge having a first terminal for coupling to the first driver and a second terminal for coupling to the first end of the data bus, and a first arithmetic unit. The second device has a second driver for generating a second output signal, a second bridge having a first terminal for coupling to the second driver and a second terminal for coupling to the second end of the data bus, and a second arithmetic unit. The first arithmetic unit processes signal levels of the first and second terminals of the first bridge to generate a first computed signal that corresponds to the second output signal, and the second arithmetic unit processes signal levels of the first and second terminals of the second bridge to generate a second computed signal that corresponds to the first output signal.

Implementations of the invention may include one or more of the following features. The first device may be a computer. The second device may be an input/output device. The second device may be a disk drive.

The details of one or more embodiments of the invention are set forth in the accompanying drawings and the description below. Other features, objects, and advantages of the invention will be apparent from the description and drawings, and from the claims.

DETAILED DESCRIPTION

Figure 1:
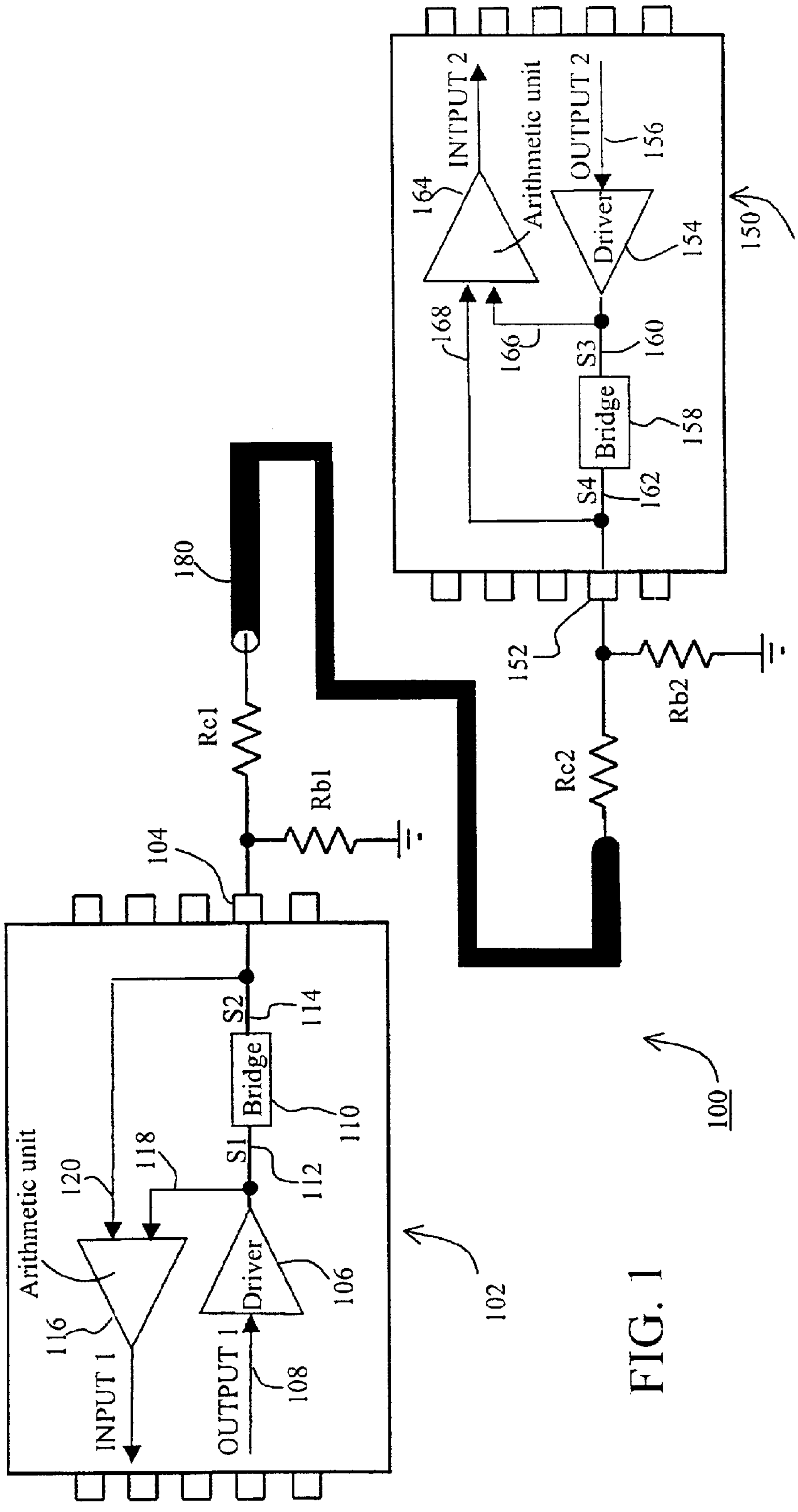
FIG. 1 is a schematic diagram of a circuit.

Referring to FIG. 1, a system 100 includes a device 102 and a device 150. Device 102 is electrically coupled to device 150 by a transmission line 180. Device 102 includes an interface port 104, a driver 106, a bridge 110, and an arithmetic unit 116. Interface port 104 is used for sending and receiving signals to and from transmission line 180. Driver 106 is used to drive an OUTPUT 1 signal coming from signal line 108. The OUTPUT 1 signal is generated by other components of device 102, and is intended to be sent to device 150 over transmission line 180. Bridge 110 has a first terminal 112 and a second terminal 114. First terminal 112 is electrically coupled to driver 106, and second terminal 114 is electrically coupled to interface port 104. Bridge 110 has a resistance of Ra1. Bridge 110 may be a resistor having two ends connected to first terminal 112 and second terminal 114, respectively.

A signal level S1 at first terminal 112 is a first combination of the OUTPUT 1 signal going to device 150 and an OUTPUT 2 signal sent from device 150. Likewise, a signal level S2 at second terminal 114 is a second combination of the OUTPUT 1 and OUTPUT 2 signals. Arithmetic unit 116 detects the signal level S1 via signal line 118, and the signal level S2 via signal line 120. Arithmetic unit 116 processes signal levels S1 and S2 according to a method described below, and generates an INPUT 1 signal that corresponds to (e.g., has substantially the same wave form as) the OUTPUT 2 signal sent from device 150. The amplitude of INPUT 1 signal may be different from that of OUTPUT 2, and there may be noise signals added into the INPUT 1 signal, but the overall wave form of INPUT 1 signal will be similar to that of OUTPUT 2.

In this embodiment, device 102 is an integrated circuit (IC) chip containing driver 106, bridge 110, and arithmetic unit 116. Interface port 104 may be a connection pin of the IC chip. In other embodiments, driver 106, bridge 110, and arithmetic unit 116 may also be discrete components placed on a circuit board, and interface port 104 may simply be a connection point on the circuit board. Parasitic resistance Rc1 may exist between interface port 104 and transmission line 180. Parasitic resistance Rb1 may exist between interface port 104 and electric ground. Parasitic resistances affect the processing performed by arithmetic unit 116 in the manner described below.

Transmission line 180 has an impedance of Z. The maximum length of transmission line 180 depends on the frequency of the OUTPUT 1 and OUTPUT 2 signals. If the OUTPUT 1 and OUTPUT 2 signals have frequencies of about 200–300 MHz, then transmission line 180 can be up to 5 inches long. The operating frequencies depend on the type of transmission line and the package parasitic capacitances, inductances, and resistances of the devices 150 and 102. If the signal frequencies are higher, the length of transmission line 180 should be shortened. Conversely, if signal frequencies are lower, the length of transmission line 180 can be made longer.

Arithmetic unit 116 processes signal levels S1 and S2 to generate the INPUT 1 signal according to the following formula:

$$\text{INPUT } \mathbf{1}=(A\mathbf{1}*S\mathbf{2})-(B\mathbf{1}*S\mathbf{1}) \quad \text{(Equ. 1)}$$

where A1 and B1 are constants that represent signal gain values, and are determined according to the following formula:

$$\frac{B1}{A1}=\frac{Rb1(Z+Rc1)}{Rb1(Z+Rc1)+Ra1(Rb1+Rc1+Z)} \quad \text{(Equ. 2)}$$

Due to non-linearity effects of transmission line 180, the ratio of A1 and B1 determined by the above formula is only an approximate value. Further tuning of the ratio between A1 and B1 may be performed for different circuit designs to improve the results.

The exact values chosen for constants A1 and B1 depend on the required signal gain for the INPUT 1 signal, but is otherwise not critical to the implementation of the invention. As an example, if Ra1=50 ohms, Rb1=50 ohms, Rc1=35 ohms, and Z=60 ohms, then B/A=(50*(60+35))/((50*(60+35)+50*(50+35+60))≈0.4. If A is chosen as 3, then B can be chosen to be 1.2. If transmission line 180 is short, then resistance Rb1 can be regarded as infinite, and resistance Rc1 can be regarded as zero. Then the ratio B1/A1 is simply Z/(Z+Ra1). If the resistance Ra1 is designed to be approximately equal to Z, then the ratio B1/A1 is approximately 0.5.

In one embodiment, the value of Ra1 is chosen to be 50 ohms. This value for Ra1 is suitable for a wide range of applications. The values of Rb1 and Rc1 depend on the particular design of the circuit board. Arithmetic unit 116 is programmable so that the values for B1 and A1 can be adjusted according Equation 2 for different values of Rb1, Rc1, and Z. In this embodiment, the signal levels S1 and S2 are voltage levels, although current levels may also be used in other embodiments.

Device 150 is similar to device 102. Device 150 includes an interface port 152, a driver 154, a bridge 158, and an arithmetic unit 164. Interface port 152 is used for sending and receiving signals to and from transmission line 180. Driver 154 is used to drive an OUTPUT 2 signal coming from signal line 156. The OUTPUT 2 signal is generated by other components of device 150, and is intended to be sent to device 102 over transmission line 180. Bridge 158 has a first terminal 160 and a second terminal 162. First terminal 160 is electrically coupled to driver 154, and second terminal 162 is electrically coupled to interface port 152. Bridge 158 has a resistance of Ra2, and may be a resistor having two ends.

A signal level S3 at first terminal 160 is a third combination of the OUTPUT 1 received from device 102 and the OUTPUT 2 signal being sent to device 102. Likewise, a signal level S4 at second terminal 162 is a fourth combination of the OUTPUT 1 and OUTPUT 2 signals. Arithmetic unit 164 detects the signal level S3 at first terminal 160 via signal line 166, and the signal level S4 at second terminal 162 via signal line 168. Arithmetic unit 164 processes the signal levels S3 and S4 according to the method described below, and generates an INPUT 2 signal that is representative of the OUTPUT 1 signal sent from device 102. The amplitude of INPUT 2 signal may be different from that of OUTPUT 1, and there may be noise signals added into the INPUT 2 signal, but the overall wave form of INPUT 2 signal is generally similar to that of OUTPUT 1.

In this embodiment, device 150 may be an IC chip containing driver 154, bridge 158, and arithmetic unit 164, and interface port 152 may be a connection pin of the IC chip. In other embodiments, driver 154, bridge 158, and arithmetic unit 164 may also be discrete components placed on a circuit board, and interface port 152 may simply be a connection point on the circuit board. Parasitic resistance Rc2 may exist between interface port 152 and transmission line 180. Parasitic resistance Rb2 may exist between interface port 152 and electric ground. Parasitic resistances may affect the computation performed by arithmetic unit 164 as described below.

The operation of device 150 is similar to that of device 102. Arithmetic unit 164 performs an arithmetic computation on signal levels S3 and S4 to generate the INPUT 2 signal according to the following formula:

$$\text{INPUT } \mathbf{2}=(A\mathbf{2}*S\mathbf{4})-(B\mathbf{2}*S\mathbf{3}) \quad \text{(Equ. 3)}$$

where A2 and B2 are constants that represent gain values, and are determined according to the following formula:

$$\frac{B2}{A2} = \frac{Rb2(Z + Rc2)}{Rb2(Z + Rc2) + Ra2(Rb2 + Rc2 + Z)} \quad \text{(Equ. 4)}$$

The ratio of A2 and B2 determined by the above formula is only an approximate value, and further tuning of the ratio may be performed to obtain improved results. In one embodiment, the value of Ra2 is chosen to be 50 ohms, and the values of Rb2 and Rc2 depend on the particular design of the circuit board. Arithmetic unit 164 is programmable so that the values for B2 and A2 can be adjusted according Equation 4 for different values of Rb2, Rc2, and Z. The signal levels S3 and S4 are voltage levels, although current levels may also be used in other embodiments.

An advantage of the invention is that signals OUTPUT 1 and OUTPUT 2 can be transmitted simultaneously over transmission line 180. When the two signals are transmitted simultaneously, the signal levels at S1, S2, S3, and S4 are combinations of OUTPUT 1 and OUTPUT 2. Arithmetic unit 116 regenerates signal OUTPUT 2 from the combination signals S1 and S2, and arithmetic unit 164 regenerates signal OUTPUT 1 from the combination signals S3 and S4. Simultaneous bi-directional transmission of signals allows the devices to exchange data at higher rates (e.g., twice the transmission speed) than devices using conventional bi-directional pins. By way of example, in the case of memory chips that have the same pins for read and write access, memory controllers no longer have to switch between read and write modes, thus avoiding delays caused by data bus turn around time.

A further advantage of the invention is that the number of pins can be reduced (e.g., by half) for chips that require simultaneous transmission and reception of signals. As an example, two-port random access memory chips in the past have a separate set of input/output lines for read and write access. Using the present system, the read and write lines can be combined to reduce the number of pins, or allow additional pins to be used for other purposes.

Figure 2:
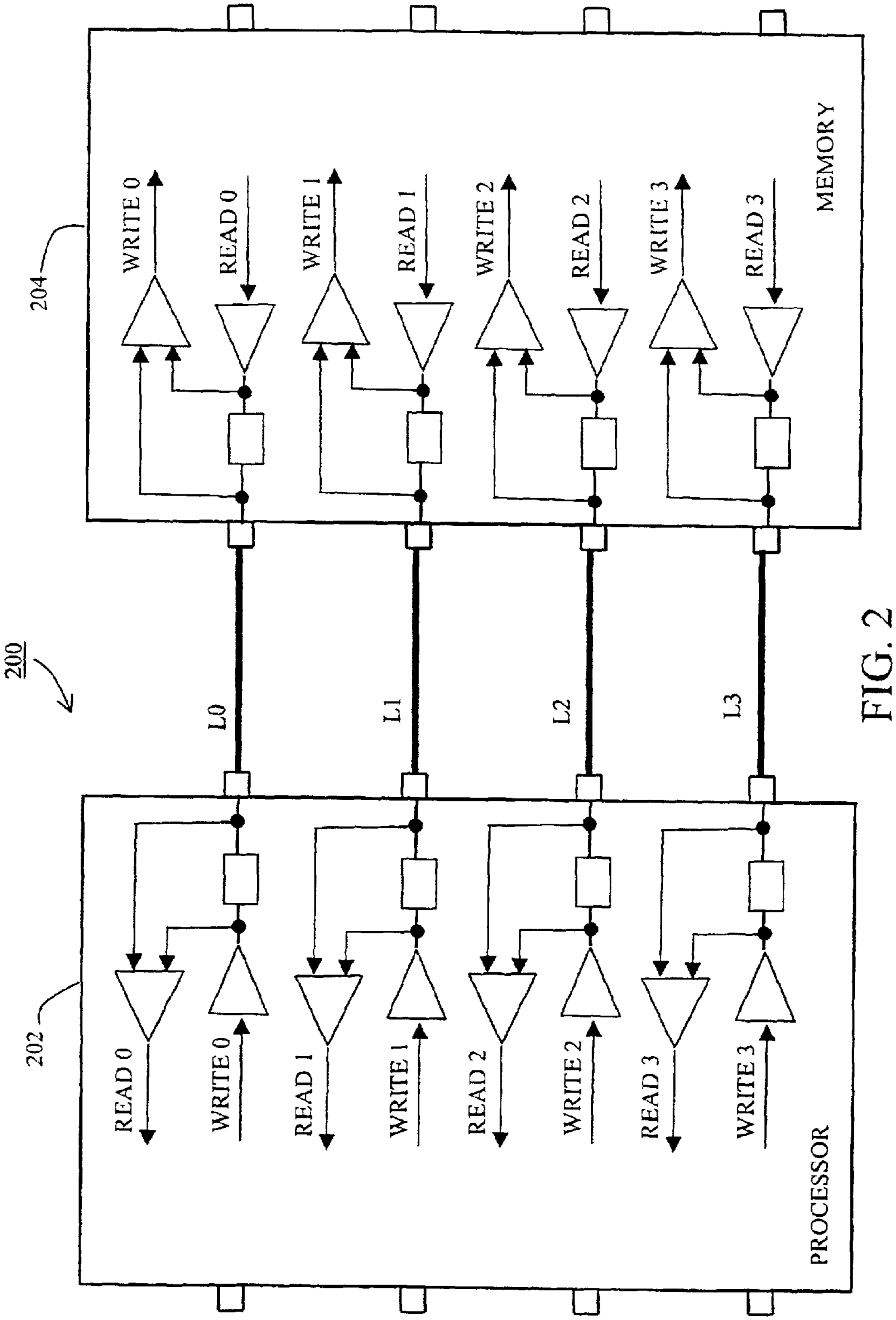
FIG. 2 is a schematic diagram of a system that includes a processor and a memory.

Referring to FIG. 2, a data processing system 200 includes a processor 202 and a memory 204. The processor 202 sends a 4-bit write data [WRITE 0, WRITE 1, WRITE 2, WRITE 3] to memory 204 via a data bus that has bus lines [L0, L1, L2, L3]. At the same time, the memory sends read data [READ 0, READ 1, READ 2, READ 3] to the processor via the data bus. Processor 202 has arithmetic units for processing the combinations of the read and write data signals to generate signals that correspond to the read data signals. Likewise, memory 204 has arithmetic units for processing the combinations of the read and write data signals to generate signals that correspond to the write data signals. Such simultaneous bi-directional transfer of read and write data significantly enhances the data processing speed of processor 202 while maintaining low pin counts for both processor 202 and memory 204.

An embodiment of the invention has been described. Nevertheless, it will be understood that various modifications may be made without departing from the spirit and scope of the invention. For example, bridge 110 and bridge 158 may have resistance that is adjustable according to different circuit designs. Device 102 and device 150 may have several interface ports that are electrically coupled to drivers, bridges, and arithmetic units to achieve simultaneous bi-directional signal transmission according to the invention. The drivers 106 and 154 may be any component that generates a signal intended for transmission.

Arithmetic logic circuits 116 and 164 may be implemented by a processor or controller running executable instructions. The arithmetic logic circuits may be implemented in hardware, software, or a combination of the two. The arithmetic logic circuits may be implemented in computer programs executing on programmable computers or other machines that each include a processor, a storage medium readable by the processor (including, but not limited to, volatile and non-volatile memory and/or storage components).

Each such program may be implemented in a high level procedural or object-oriented programming language to communicate with a computer system. However, the programs can be implemented in assembly or machine language. The language may be a compiled or an interpreted language.

Each computer program may be stored on a storage medium/article (e.g., CD-ROM, hard disk, or magnetic diskette) that is readable by a general or special purpose programmable computer for configuring and operating the computer when the storage medium or device is read by the computer to implement the arithmetic logic circuits. The arithmetic logic circuits may also be implemented as a machine-readable storage medium, configured with a computer program, where, upon execution, instructions in the computer program cause a machine to operate to determine the values of the OUTPUT1 and OUTPUT2 signals.

Other embodiments are also within the scope of the following claims.

What is claimed is:

1. Apparatus having an interface port for simultaneously transmitting and receiving input and output signals, comprising:

a first circuit for generating an output signal;

a second circuit having a first terminal and a second terminal, the first terminal coupled to the first circuit, the second terminal coupled to the interface port, a signal level at the first terminal representing a first combination of the input and output signals, and a signal level at the second terminal representing a second combination of the input and output signals; and a third circuit coupled to the first and second terminals of the second circuit for determining the input signal based on the signal levels at the first and second terminals.

2. The apparatus of claim 1, wherein the second circuit comprises a resistor, the first terminal comprises a first end of the resistor, and the second terminal comprises a second end of the resistor.

3. The apparatus of claim 1, wherein the third circuit processes the first and second combinations of the input and output signal levels to generate a signal that corresponds to the input signal.

4. The apparatus of claim 1, wherein the third circuit multiplies the first combination of the input and output signal levels by a first constant to generate a first number and multiplies the second combination of the input and output signal levels by a second constant to generate a second number, the difference between the second and the first numbers corresponding to the input signal.

5. The apparatus of claim 4, wherein the interface port is coupled to a transmission line having an impedance of Z, the second circuit has a resistance of Ra, and the ratio between the first constant and the second constant is approximately equal to Z/(Z+Ra).

6. The apparatus of claim 4, wherein the interface port is coupled to a transmission line having an impedance of Z via a resistance of Rc, the interface port being coupled to electric ground via a resistance of Rb, the second circuit having a resistance of Ra, and the ratio between the first constant and the second constant being approximately equal to Rb*(Z+Rc)/(Rb*(Z+Rc)+Ra*(Rb+Rc+Z)).

7. An integrated circuit comprising:

a first circuit for providing a variable output signal;

an internal impedance having a first terminal and a second terminal, the first terminal electrically connected to the first circuit;

an interface port electrically connected to the second terminal of the internal impedance, a signal level at the interface port corresponding to a combination of the variable output signal and an input signal from an external circuit; and a second circuit for processing the signal levels at the first and second terminals at the internal impedance to generate a signal that corresponds to the input signal from the external circuit.

8. The apparatus of claim 7, wherein the second circuit multiplies a signal level at the first terminal of the internal impedance by a first constant to generate a first number and multiplies a signal level at the second terminal of the internal impedance by a second constant to generate a second number, the difference between the second and the first numbers corresponding to the input signal.

9. The apparatus of claim 8, wherein the interface port is coupled to a transmission line having an impedance of Z, the second circuit has a resistance of Ra, and the ratio between the first constant and the second constant is approximately equal to Z/(Z+Ra).

10. The apparatus of claim 8, wherein the interface port is coupled to a transmission line having an impedance of Z via a resistor having a resistance of Rc, the interface port being coupled to electric ground via a resistance of Rb, the second circuit having a resistance of Ra, and the ratio between the first constant and the second constant being approximately equal to Rb(Z+Rc)/(Rb(Z+Rc)+Ra(Rb+Rc+Z)).

11. A system comprising:

a transmission line having a first end and a second end;

a first driver for generating a first output signal;

a first bridge having a first terminal for coupling to the first driver and a second terminal for coupling to the first end of the transmission line;

a second driver for generating a second output signal;

a second bridge having a first terminal for coupling to the second driver and a second terminal for coupling to the second end of the transmission line;

a first arithmetic unit for processing signal levels of the first and second terminals of the first bridge to generate a first computed signal that corresponds to the second output signal; and a second arithmetic unit for processing signal levels of the first and second terminals of the second bridge to generate a second computed signal that corresponds to the first output signal.

12. The system of claim 11, wherein the first bridge comprises a first resistor, the first terminal of the first bridge comprises a first end of the first resistor, the second terminal of the first bridge comprises a second end of the first resistor, the second bridge comprises a second resistor, the first terminal of the second bridge comprises a first end of the second resistor, and the second terminal of the second bridge comprises a second end of the second resistor.

13. The system of claim 11, wherein the first arithmetic unit multiplies a signal level at the first terminal of the first bridge by a first constant to generate a first number and multiplies a signal level at the second terminal of the first bridge by a second constant to generate a second number, the difference between the second and the first numbers corresponding to the input signal.

14. The system of claim 13, wherein the transmission line has an impedance of Z, the first bridge has a resistance of Ra, and the ratio between the first constant and the second constant is approximately equal to Z/(Z+Ra).

15. The apparatus of claim 13, wherein the transmission line has an impedance of Z, the first bridge has a resistance of Ra, the second terminal of the first bridge is coupled to electric ground via a resistance of Rb, the second terminal of the first bridge is coupled to the transmission line via a resistance of Rc, and the ratio between the first constant and the second constant is approximately equal to Rb*(Z+Rc)/(Rb*(Z+Rc)+Ra*(Rb+Rc+Z)).

16. A memory chip comprising:

an interface pin for simultaneously reading in write data to the memory chip and sending out read data from the memory chip;

a driver for generating the read data;

an internal impedance having a first and a second terminals, the first terminal being electrically coupled to the driver and the second terminal being electrically coupled to the interface pin; and an arithmetic unit for processing signal levels of the first and second terminals of the internal impedance and for generating a signal corresponding to the write data.

17. The memory chip of claim 16, wherein the arithmetic unit multiplies a signal level at the first terminal by a first constant to generate a first number and multiplies a signal level at the second terminal by a second constant to generate a second number, the difference between the second and the first numbers corresponding to the write data.

18. The memory chip of claim 16, wherein the interface pin is coupled to a transmission line having an impedance of Z, the internal impedance has an impedance of Ra, and the ratio between the first constant and the second constant is approximately equal to Z/(Z+Ra).

19. The memory chip of claim 16, wherein the interface pin is coupled to a transmission line having an impedance of Z via a resistance of Rc, the interface pin being coupled to electric ground via a resistance of Rb, the internal impedance having an impedance of Ra, and the ratio between the first constant and the second constant being approximately equal to Rb*(Z+Rc)/(Rb*(Z+Rc)+Ra*(Rb+Rc+Z)).

20. A system comprising:

a data bus having a first end and a second end;

a processor for generating write data, the processor having a first interface port and a first arithmetic unit, the first interface port being coupled to the first end of the data bus; and a memory for generating read data, the memory having a second interface port and second arithmetic unit, the second interface port being electrically coupled to the second end of the data bus;

wherein the write data is sent from the processor to the memory via the data bus at the same time that the read data is sent from the memory to the processor via the data bus, the first arithmetic unit processing combinations of the write and read data to generate a first computed signal corresponding to the read data, and the second arithmetic unit processing combinations of the read and write data to generate a second computed signal corresponding to the write signal.

21. The system of claim 20, wherein the processor further comprises a first driver and a first bridge, the first driver generating the write data, the first bridge having a first terminal coupled to the first driver and a second terminal coupled to the first end of the data bus, the first arithmetic unit processing the signal levels at the first and second terminals of the first bridge to generate the first computed signal.

22. The system of claim 21, wherein the first arithmetic unit multiplies the signal level at the first terminal of the first bridge by a first constant to generate a first number and multiplies the signal level at the second terminal of the first bridge by a second constant to generate a second number, the difference between the second and the first numbers corresponding to the read signal.

23. The system of claim 20, wherein the memory further comprises a second driver and a second bridge, the second driver generating the read signal, the second bridge having a first terminal coupled to the second driver and a second terminal coupled to the second end of the data bus, the second arithmetic unit processing the signal levels at the first and second terminals of the second bridge to generate the second computed signal.

24. The system of claim 23, wherein the second arithmetic unit multiplies the signal level at the first terminal of the second bridge by a third constant to generate a third number and multiplies the signal level at the second terminal of the second bridge by a fourth constant to generate a fourth number, the difference between the fourth and the third numbers corresponding to the write signal.

25. A system comprising:

a data bus having a first end and a second end;

a first device comprising:

a first driver for generating a first output signal, a first bridge having a first terminal for coupling to the first driver and a second terminal for coupling to the first end of the data bus, and a first arithmetic unit; and a second device comprising:

a second driver for generating a second output signal, a second bridge having a first terminal for coupling to the second driver and a second terminal for coupling to the second end of the data bus, and a second arithmetic unit;

wherein the first arithmetic unit processes signal levels of the first and second terminals of the first bridge to generate a first computed signal that corresponds to the second output signal, and the second arithmetic unit processes signal levels of the first and second terminals of the second bridge to generate a second computed signal that corresponds to the first output signal.

26. The system of claim 25, wherein the first device is a computer.

27. The system of claim 26, wherein the second device is a disk drive.

28. The system of claim 26, wherein the second device is an input/output device.

* * * * *